United States Patent
Monson et al.

(10) Patent No.: US 8,743,544 B2
(45) Date of Patent: Jun. 3, 2014

(54) CARDLOCK CLAMP

(71) Applicant: Lockheed Martin Corporation, Bethesda, MD (US)

(72) Inventors: Robert J. Monson, St. Paul, MN (US); Kevin J. Thorson, Eagan, MN (US); Melissa A. Grette-Compton, Eagan, MN (US); Kent D. Katterheinrich, Coon Rapids, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/026,221

(22) Filed: Sep. 13, 2013

(65) Prior Publication Data
US 2014/0016998 A1    Jan. 16, 2014

Related U.S. Application Data

(63) Continuation of application No. 12/901,687, filed on Oct. 11, 2010, now Pat. No. 8,559,178.

(51) Int. Cl.
*H05K 7/02* (2006.01)
*H05K 7/14* (2006.01)
*H05K 7/20* (2006.01)

(52) U.S. Cl.
CPC .......... *H05K 7/1404* (2013.01); *H05K 7/1407* (2013.01); *H05K 7/2049* (2013.01)
USPC ........... 361/704; 361/715; 361/710; 361/720; 361/801

(58) Field of Classification Search
None
See application file for complete search history.

(56) References Cited

U.S. PATENT DOCUMENTS

| | | | |
|---|---|---|---|
| 2,643,143 A * | 6/1953 | Bergqvist | ........................ 403/18 |
| 3,845,359 A | 10/1974 | Fedele | |
| 4,298,904 A | 11/1981 | Koenig | |
| 4,330,812 A | 5/1982 | Token | |
| 4,644,444 A | 2/1987 | Rush | |
| 5,047,297 A * | 9/1991 | Wakamatsu et al. | ....... 428/832.2 |
| 5,859,764 A | 1/1999 | Davis et al. | |
| 5,883,784 A | 3/1999 | Hughes et al. | |
| 6,285,564 B1 | 9/2001 | O'Brien | |
| 7,031,167 B1 * | 4/2006 | Zagoory et al. | ................ 361/759 |

(Continued)

FOREIGN PATENT DOCUMENTS

| | | |
|---|---|---|
| EP | 0461909 | 6/1991 |
| EP | 1853097 | 11/2007 |

OTHER PUBLICATIONS

International Search Report for international application No. PCT/US2011/054573, dated Jan. 3, 2012 (4 pages).

(Continued)

*Primary Examiner* — Gregory Thompson
(74) *Attorney, Agent, or Firm* — Hamre, Schumann, Mueller & Larson, P.C.

(57) ABSTRACT

A cardlock clamp is described that is used to secure an electronics module in a channel of a card cage. The cardlock clamp is configured to convert an input compression force into clamping forces in at least two radial directions perpendicular to the input compression force. The described cardlock clamp also provides self-alignment and self-center functions for the electronics module inserted into the channel. Further, variations of the cardlock clamp are described that provide more effective heat transfer from the electronics module to the card cage.

12 Claims, 9 Drawing Sheets

(56) References Cited

U.S. PATENT DOCUMENTS

| | | |
|---|---|---|
| 8,045,332 B2 * | 10/2011 | Lee et al. .................. 361/759 |
| 8,208,265 B2 | 6/2012 | Suarez et al. |
| 8,233,279 B2 | 7/2012 | Sporer |
| 8,456,846 B2 * | 6/2013 | Mosier et al. ............... 361/728 |
| 8,559,178 B2 * | 10/2013 | Monson et al. ............. 361/700 |
| 2010/0020514 A1 | 1/2010 | Lee et al. |
| 2011/0058336 A1 | 3/2011 | Sundstrom et al. |

OTHER PUBLICATIONS

Written Opinion for international application No. PCT/US2011/054573, dated Jan. 3, 2012 (7 pages).

* cited by examiner

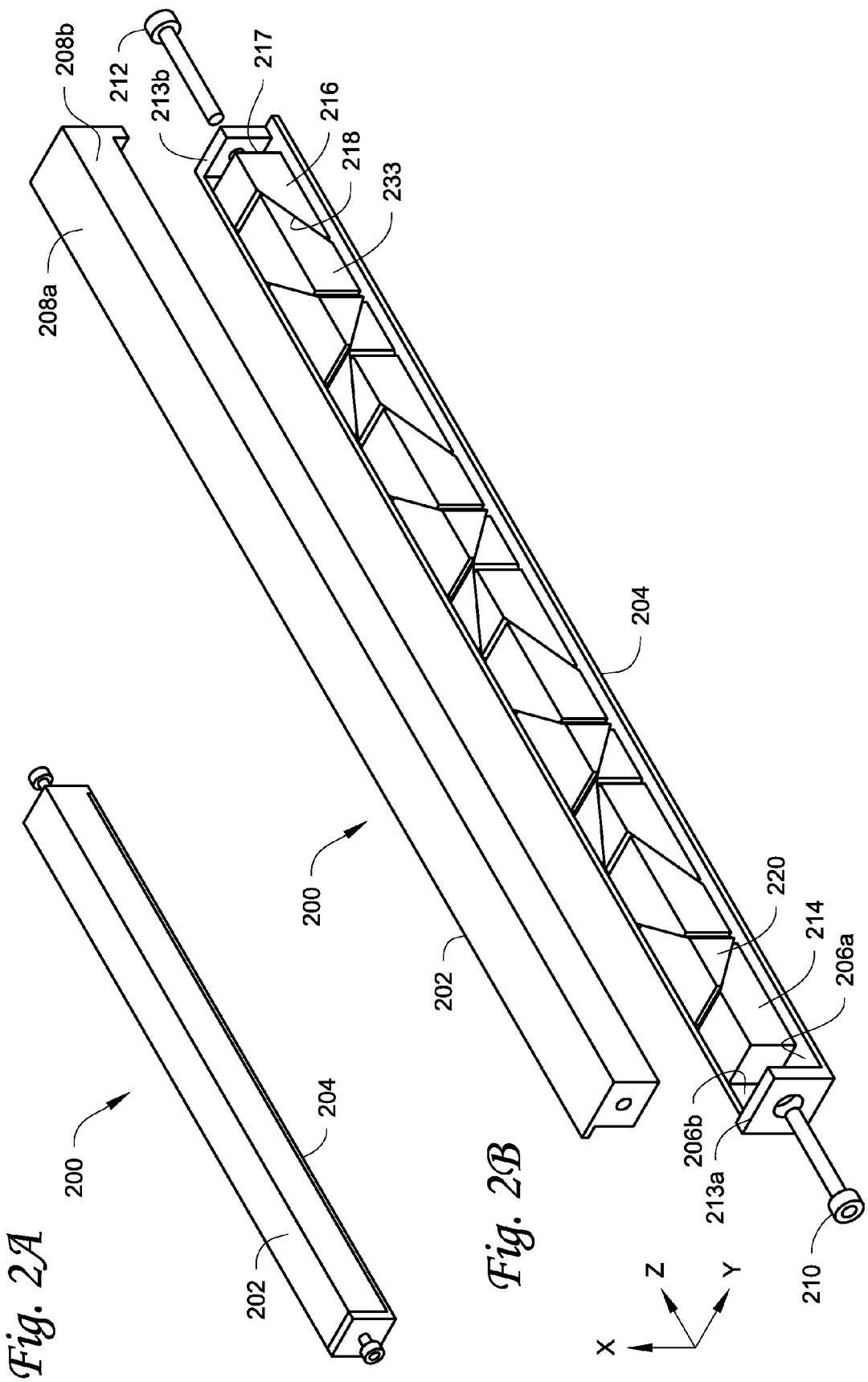

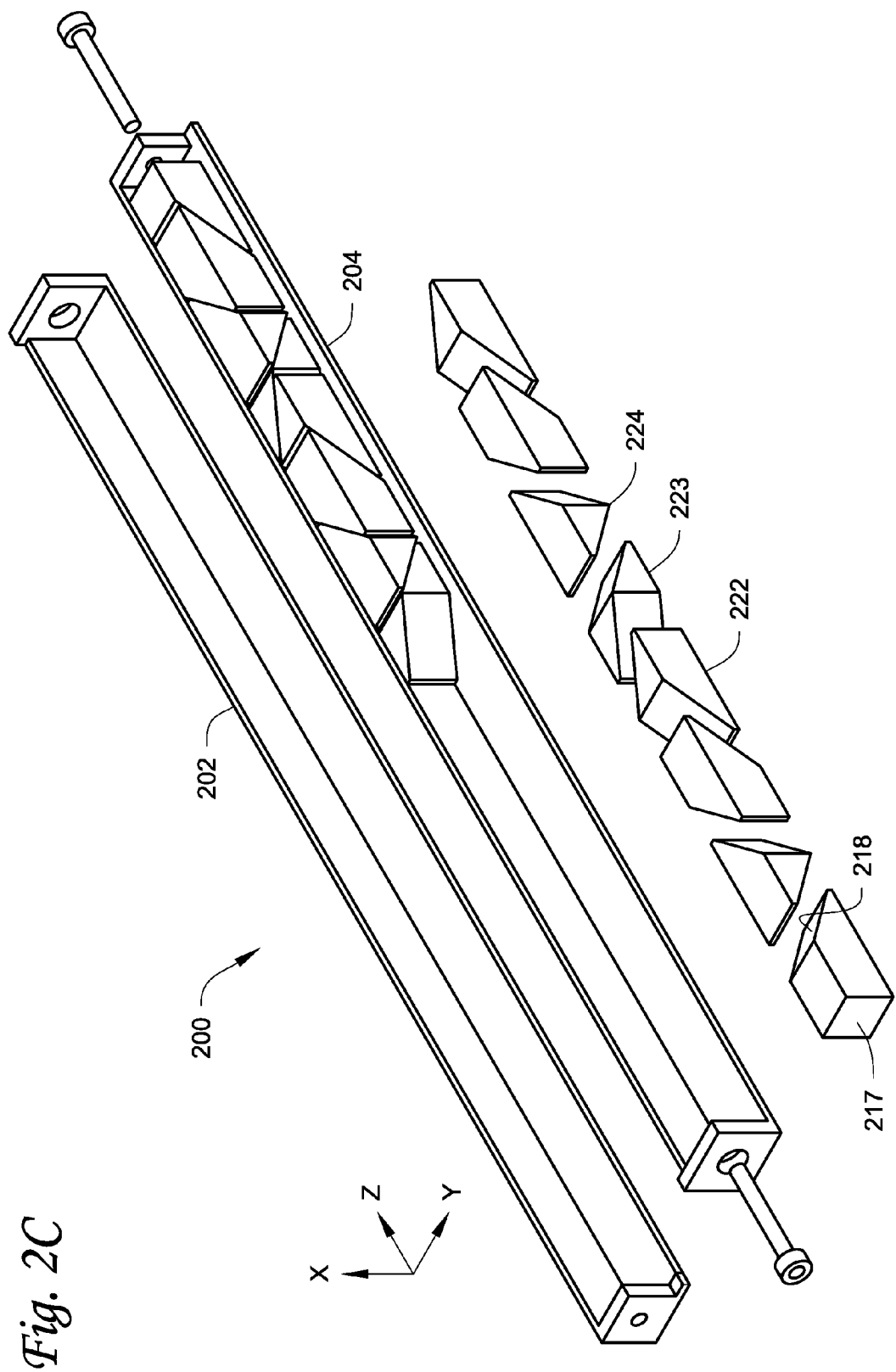

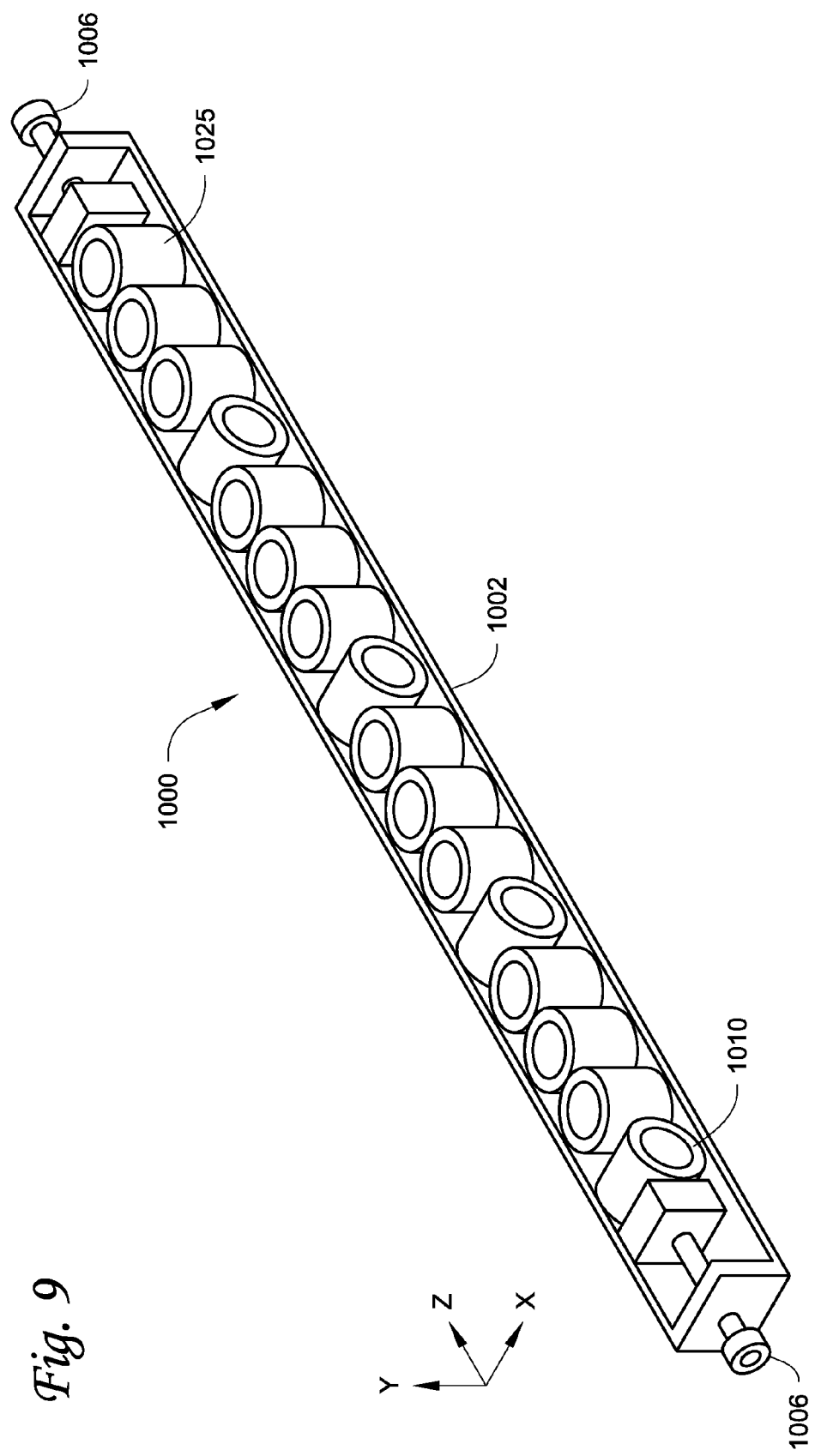

CARDLOCK CLAMP

FIELD

This disclosure relates to a clamp, and more particularly to a cardlock clamp to secure an electronics module.

BACKGROUND

In certain applications, a circuit card is secured in a channel in a chassis of a card cage by a clamping device in the form of a wedgelock device. In addition to securing the circuit card, the clamping device is often configured to provide some thermal interface between the circuit card and the card cage to remove heat from the circuit card to the card cage.

SUMMARY

A cardlock clamp is described that is used to secure an electronics module such as a circuit card in a channel in a chassis of a card cage. The described cardlock clamp is configured to convert an input compression force into clamping forces in at least two radial directions perpendicular to the compression force. The clamping forces are uniformly distributed along the longitudinal axis of the cardlock clamp and the ratio between the clamping forces in the at least two radial directions is adjustable. The described cardlock clamp also provides self-centering and self-alignment functions with respect to the circuit card and the card cage. Further, the described cardlock clamp is configured to provide a more effective means of transferring heat from the circuit card to the card cage, for example via the surface of the cardlock clamp.

In contrast, conventional wedgelock devices function based on an input tensile force to create a clamping force, and only clamp in one direction. Further, conventional wedgelock devices transfer thermal energy by means of conduction from the circuit cards through the wedgelock device body, which can be a slow and inefficient process and is highly dependent on the thermal flow path cross-section in contact within and contact pressure at the interface surfaces.

In one disclosed example, a cardlock clamp used to secure an electronics module in a channel includes a member that is expandable in at least two radial directions. The member includes an input compression force mechanism. The input compression force mechanism is configured to apply a compression force in a z-direction substantially perpendicular to the at least two radial directions. A plurality of force converting elements are provided in the member and are engageable with the member. The force converting elements are engageable with the input compression force mechanism and are configured to convert the compression force of the input compression force mechanism into clamping forces that act on the member in the at least two radial directions in order to transfer the clamping forces to the member.

In another disclosed example, a cardlock clamp used to secure an electronics module in a channel includes a first surface that in use contacts the electronics module and a second surface that in use contacts a heat sink and being connected to the first surface. The first surface and the second surface include a thermally conductive material having at least one material selected from the group consisting of diamond, copper, aluminum, carbon nano-tubes, and their compounds. When the cardlock clamp is installed in the channel, the first surface engages the electronics module, the second surface engages the heat sink, and heat is transferred from the electronics module to the heat sink.

In another disclosed example, a cardlock clamp used to secure an electronics module in a channel includes a clamp body having a first moveable bracket configured as a heat pipe. The heat pipe has a vaporization side configured to engage the electronics module when the cardlock clamp is installed in the channel, a condensing side spaced from the vaporization side and configured to engage a heat sink when the cardlock clamp is installed in the channel, and a two-phase heat transfer fluid within the heat pipe. The cardlock clamp further includes a mechanism for applying a clamping force to the first bracket.

In another disclosed example, a clamp mechanism includes an input compression force mechanism that is configured to input a compression force in a z-direction. A plurality of force converting elements engage with the input compression force mechanism and are configured to convert an compression force input of the input compression force mechanism into clamping forces in at least two radial directions. The at least two radial directions are substantially perpendicular to the z-direction.

DRAWINGS

FIG. 2(a) is a perspective view of an embodiment of a cardlock clamp described herein with two L-shaped brackets.

FIG. 2(b) is an exploded perspective view of the cardlock clamp of FIG. 2(a) with one bracket lifted and showing double ended wedges that act as force converting elements.

FIG. 2(c) is another exploded perspective view of the cardlock clamp of FIG. 2(a) with some of the double ended wedges out of the brackets.

FIG. 9 is an exploded perspective view of another embodiment of a cardlock clamp using tubes.

DETAILED DESCRIPTION

A cardlock clamp is described that is used to secure a circuit card in a channel of a card cage. The described cardlock clamp converts an input compression force into clamping forces in at least two radial directions perpendicular to the compression force. The described cardlock clamp also provides self-alignment and self-center functions with respect to the circuit card and the card cage. Further, the described cardlock clamp can also provide a more effective means of transferring heat from the circuit card.

Figure 1:
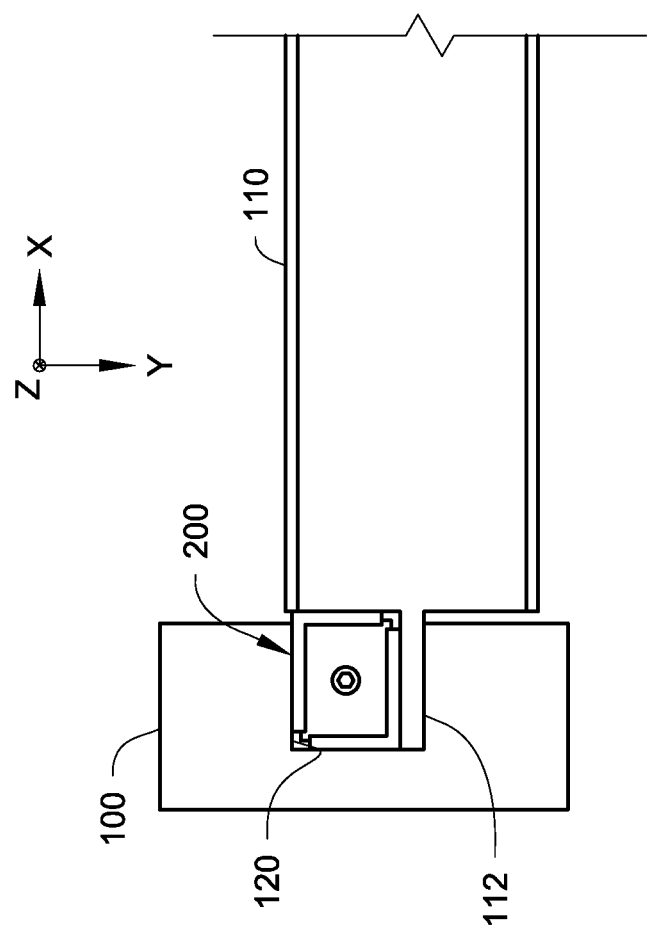
FIG. 1 is a side view of a circuit card mounted in a channel of a card cage and secured by a cardlock clamp described herein.

FIG. 1 illustrates an exemplary working environment for a cardlock clamp 200 described herein to secure a circuit card 110 in a channel 120 in a chassis of a card cage 100. The card cage 100 has at least one channel 120 extending along a z-direction. Each of the channels 120 is defined by two side surfaces and a bottom surface. All the surfaces of one channel can be a heat sink for the circuit card to be secured therein. The circuit card 110 has a flange 112 protruding from one end of the circuit card 110 into the channel 120. When the circuit card 110 is mated in one of the channels 120 of the card cage 100, the cardlock clamp 200 is disposed between the flange 112 and one of the side surfaces of the channel 120 to clamp the circuit card 110 in the channel 120.

The cardlock clamp 200 is configured to convert an input compression force applied in the z-direction into clamping forces in four directions, such as along the x-direction and the y-direction, simultaneously. The x-direction, the y-direction and the z-direction are perpendicular to each other. In the y-direction, the cardlock clamp 200 is expandable to make positive contact with the flange 112 of the circuit card 110 on one side and make positive contact with one of the side surfaces of the channel 120 on the other side. At the same time, the flange 112 of the circuit card 110 is pushed by the cardlock clamp 200 to make positive contact with the other of the side surfaces of the channel 120. In this manner, the circuit card 110 is secured by the cardlock clamp 200 in the channel 120 of the card cage 100. In the x-direction, the cardlock clamp 200 is also expandable to make positive contact with the circuit card 110 on one side and make positive contact with the bottom surface of the channel 120 on the other side so that the cardlock clamp 200 is self-aligned and self-centered with respect to the circuit card 110 and the channel 120 of the card cage 100. Heat can be transferred from the circuit card 110 to the heat sink through the cardlock clamp 200.

In another exemplary working environment, a circuit card has two flanges (such as the flange 112) at two opposite ends of the circuit card. The flanges protrude into two channels of a card cage (such as the card cage 100) and secured by two cardlock clamps (such as the cardlock clamp 200) in a manner described above in FIG. 1. Each of the cardlock clamps is expandable in at least two radial directions (such as the x-direction and the y-direction) so that the cardlock clamps push against one another through the circuit card and exert contact pressure on bottom surfaces of both channels to secure the circuit card in the card cage.

FIGS. 2(a), 2(b), 2(c), 3(a), 3(b) and 4 illustrate a first embodiment of the cardlock clamp 200 used to secure a circuit card in a channel. In the illustrated embodiment, the cardlock clamp 200 has a member in the exemplary form of two elongated L-shaped brackets 202 and 204. The L-shaped brackets 202 and 204 extend in the z-direction, are aligned at a first end and a second end, and when assembled define a cavity that receives a plurality of force converting elements. The force converting elements, described further below, are engageable with one or more input compression force mechanisms and are configured to convert an input compression force into clamping forces that act on the L-shaped brackets in order to transfer the clamping forces to the L-shaped brackets.

Each of the L-shaped brackets has two inner surfaces 206a, 206b and two outer surfaces 208a, 208b. The inner and outer surfaces are substantially perpendicular to the x-direction or the y-direction. The L-shaped brackets 202 and 204 are movable relative to each other in the x-direction and in the y-direction. Although two L-shaped brackets are described, any other number of brackets or any other shaped brackets can be used. For example, four separate plates can be used as the brackets to define the cavity.

The input compression force mechanisms of the cardlock clamp 200 include two screws 210 and 212 disposed at the first end and the second end. The screws 210, 212 extend through threaded holes formed in end walls 213a, 213b of the brackets 203, 204. The input force compression mechanism also includes two end pieces 214 and 216 that are disposed inside the space defined by the brackets. The end pieces 214, 216 are positioned so as to be acted on by the ends of the screws 210 and 212, respectively.

Each of the end pieces 214, 216 has a flat surface 217 on one end that is orthogonal to the z-direction and an angled sliding surface 218 having an oblique angle with respect to the z-direction on the other end. The end of each screw 210, 212 makes positive contact with the flat surface 217 of the respective end piece 214, 216 to input one or more compression forces. The screws are movable by rotating the screws in the appropriate direction, which causes the screws to move in the z-direction and exert an input compression force on the end pieces 214, 216.

Although the clamp 200 has been described as having two input force compression mechanisms, one mechanism at each end of the clamp, a single input force compression mechanism can be used. In addition, even if two input force compression mechanisms are provided on the clamp, one mechanism can remain fixed while only one mechanism is used to apply an input compression force.

In addition, although the use of screws and end pieces to form the input compression mechanisms has been described, other input compression force mechanisms can also be used as long as they can input a compression force to the plurality of force converting elements.

The cardlock clamp 200 further has a plurality of force converting elements 220-233 disposed therein. In the illustrated embodiment, the force converting elements 220-233 are in the form of multidirectional wedges that are identical to each other. However, it is contemplated that the force converting elements need not be identical to each other. Each multidirectional wedge has at least two angled sliding surfaces engaged with corresponding angled sliding surfaces of an adjunct wedge as to convert the compression force into clamping forces in at least two radial directions. The multidirectional wedges are illustrated as double ended wedges having two angled sliding surfaces in the cardlock clamp 200. However, multidirectional wedges having more than two angled sliding surfaces can also be used.

The double ended wedges are aligned along the z-direction between the two end pieces 214 and 216. The double ended wedges are engaged with each other and are configured to convert the input compression forces in the z-direction from the end pieces 214 and 216 into clamping forces in at least two radial directions, such as the x-direction and the y-direction. Although 14 double ended wedges are illustrated, a larger or smaller number of wedges can be used. In general, the more double ended wedges that are used, the more uniform the clamping forces are distributed on the inner surfaces of the brackets.

Figure 3A:
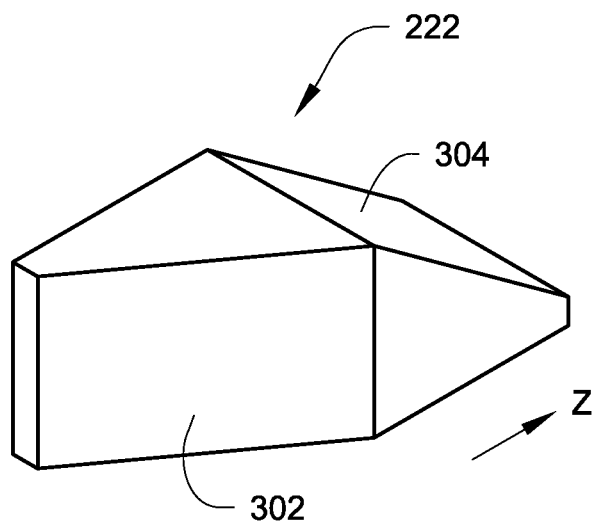
FIG. 3(a) illustrates a perspective view of an exemplary double ended wedge.
Figure 3B:
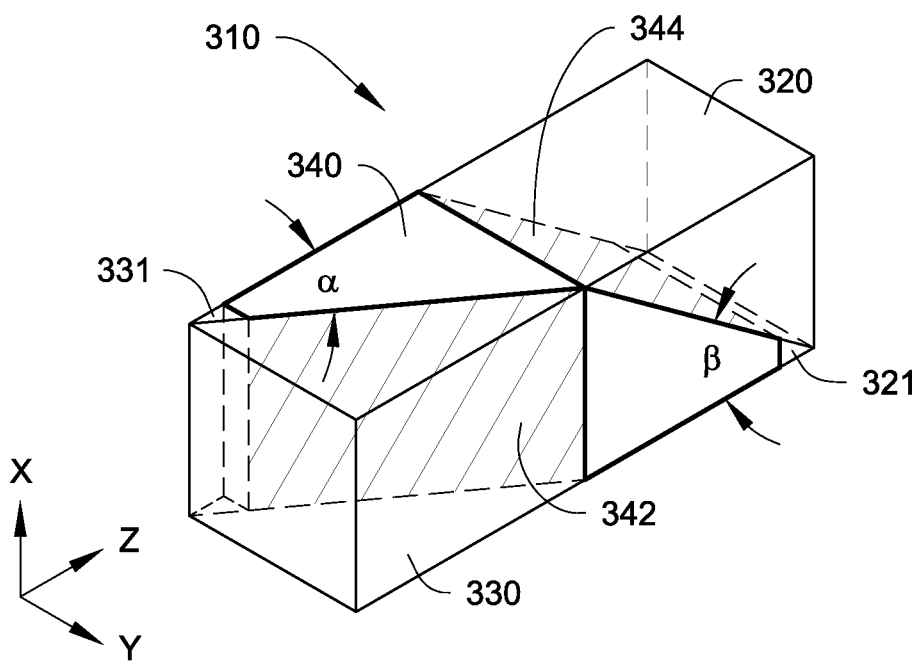
FIG. 3(b) illustrates one embodiment of forming the double ended wedge.

FIG. 3(a) illustrates a perspective view of one of the double ended wedges 222. Since the wedges are identical, only one wedge will be described. The double ended wedge 222 has a first angled sliding surface 302 at one end and a second angled sliding surface 304 at the other end. Each of the angled sliding surfaces forms an oblique angle with respect to the z-direction. As illustrated in FIG. 3(b), the double ended wedge 222 can be formed from a rectangular cuboid 310 by cutting away two triangular prisms 320 and 330 and cutting away two triangular prisms 321 and 331 at corners so that the remaining part 340 resembles a pair of back to back wedges 342 and 344 (shown as the shaded surfaces in FIG. 3b) with one wedge rotated relative to the other. The wedges 342 and 344 form angles α and β with respect to the z-direction, respectively. The angles α and β are changeable. The ratio between the clamping forces in at least two radial directions, such as the x-direction and the y-direction can be adjusted by varying the angles α and β.

Figure 4A:
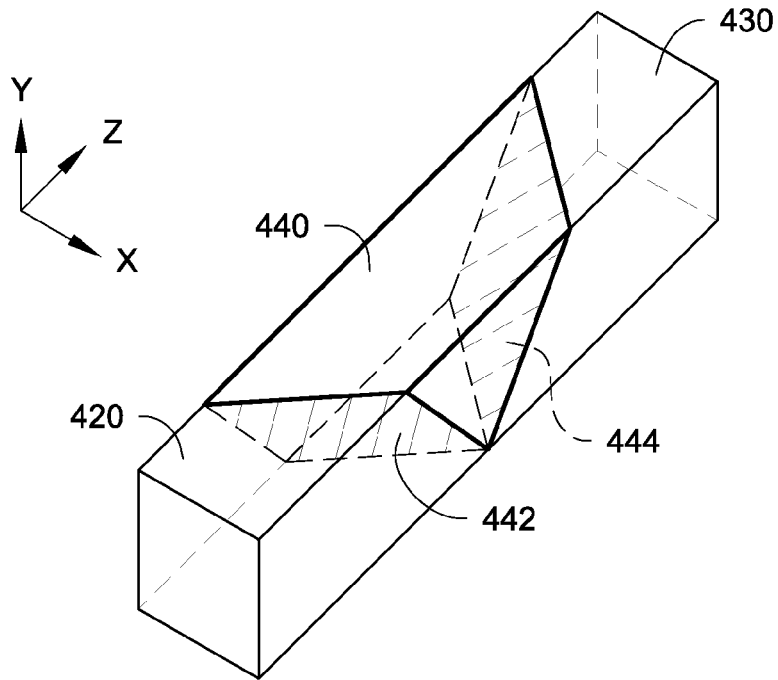
FIG. 4(a) illustrates another embodiment of an exemplary double ended wedge engaged with two end pieces.

FIG. 4(a) illustrate another embodiment of a double ended wedge. The double ended wedge 440 has a first angled sliding surface 442 and a second angled sliding surface 444 (shown as the shaded surfaces in FIG. 4a). Each of the angled sliding surfaces is oblique with respect to the x-direction, the y-direction and the z-direction and matches with an angled sliding surface of end piece 420, 430.

Figure 4B:
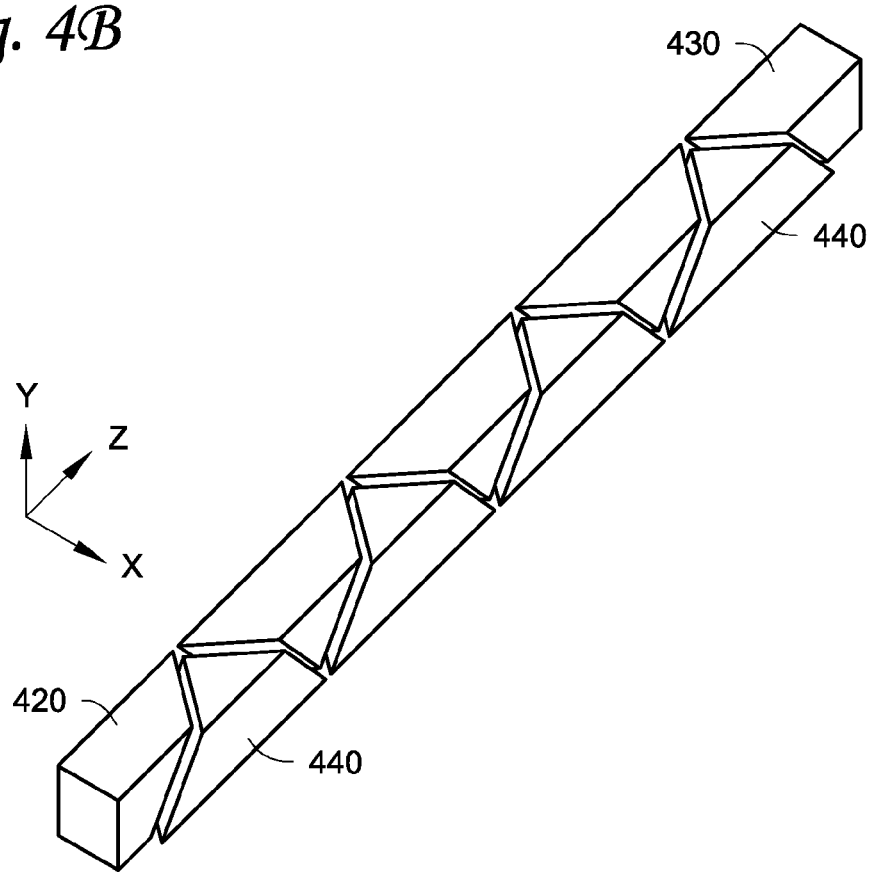
FIG. 4(b) illustrates an exploded perspective view of the double ended wedges of FIG. 4(a) engaged with each other and with the end pieces.

FIG. 4(b) illustrate 7 identical double ended wedges 440 engage with each other and engage with the end pieces 420 and 430. Similar to the double ended wedge 222, the double ended wedges 440 are engaged with each other and are configured to convert an input compression forces in the z-direction from the end pieces 420 and 430 into clamping forces in at least two radial directions, such as the x-direction and the y-direction. The ratio between the clamping forces in the at least two radial directions can be adjusted by varying angles between the angled sliding surfaces of the double ended wedge 440 and the at least two radial directions.

With reference to FIGS. 2(b) and 2(c), the end pieces 214 and 216 are engaged with the double ended wedges 220 and 233, respectively. The angled sliding surface 218 of the end piece 214 matches the first angled sliding surface 302 of the double ended wedge 220, and the angled sliding surface 218 of the end piece 216 matches the second angled sliding surface 304 of the double ended wedge 233. The double-ended wedges are also arranged and oriented relative to one another so that they are engaged with each other through their respective angled sliding surfaces.

For example, as shown in FIG. 2(c), the double ended wedge 223 is engaged with its adjacent double ended wedges 222 and 224 through their respective angled sliding surfaces. The second angled sliding surface of the double ended wedge 222 matches the first angled sliding surface of the double ended wedge 223, and the second angled sliding surface of the double ended wedge 223 matches the first angled sliding surface of the double ended wedge 224.

The configuration and ultimate arrangement of the wedges in the brackets 202, 204 is such that upon a compression force input by one or both of the input compression force mechanisms, the column of wedges expands in all directions orthogonal to the compression force. The expansion of the wedges acts on the brackets to create the clamping forces. The wedges remain in-line with the longitudinal axis (along the z-direction) of the cardlock clamp.

For example, upon the input compression force from the screw(s) 210 or 212 through the end pieces 214 and 216, each of the double ended wedges has first and second angled sliding surfaces 302, 304 configured to slide with respect to adjacent matching angled sliding surfaces. For example, as shown in FIG. 2(c), the first angled sliding surface 302 of the double ended wedge 223 is configured to slide with respect to the second angled sliding surface 304 of the double ended wedge 222, and the second angled sliding surface 304 of the double ended wedge 223 is configured to slide with respect to the first angled sliding surface 302 of the double ended wedge 224. The first angled sliding surface of the double ended wedge 220 is configured to slide with respect to the angled sliding surface of the end piece 214, and the second angled sliding surface of the double ended wedge 233 is configured to slide with respect to the angled sliding surface of the end piece 216. In this manner, the column of double ended wedges is movable both in the x-direction and in the y-direction upon application of the input compression force.

Figure 5:
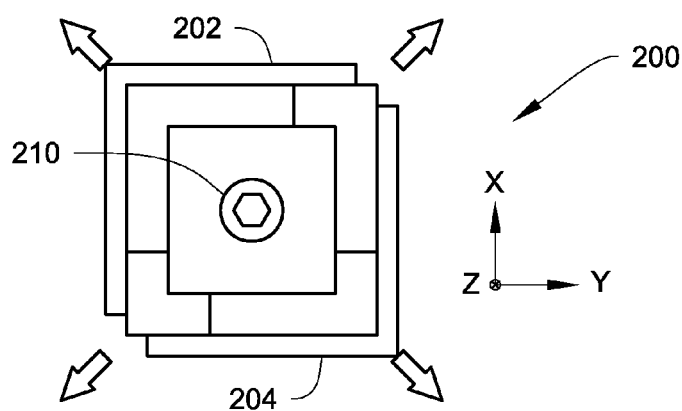
FIG. 5 illustrates an end view of the cardlock clamp of FIG. 2(a) in a locked position and showing the resulting clamping forces.

The double ended wedges are supported by the L-shaped brackets 202 and 204. Consequently, as shown in FIG. 5, the L-shaped brackets 202 and 204 are pushed away from each other by the double ended wedges upon application of an input compression force, generate clamping forces both in the x-direction and in the y-direction as illustrated by the arrows in FIG. 5.

Upon an input compression force, the double ended wedges convert the compression force into clamping forces in at least two radial directions perpendicular to the compression force and expand the L-shaped brackets in the radial directions such as the x-direction and the y-direction. Note that even if the L-shaped brackets are constrained in expanding in one or more of the at least two radial directions, the L-shaped brackets can still expand in the remaining radial directions upon the input compression force. For example, the clamp 200 in FIG. 1 expands in the y-direction to contact the side surfaces of the channel 120 and stop expanding, while the clamp can still expand in the x-direction until it meet constrains in the x-direction.

Since the double ended wedges are free to move independently and remain in-line with the longitudinal axis of the cardlock clamp, they self-center and self-align the cardlock clamp with respect to the channel of the card cage. For example, if a first end of a cardlock clamp (such as the cardlock clamp 200) is placed at a first end with a standard width of a channel, but a second end opposing to the first end is at a second end of the same channel wider than the first end, the wedges at the second end would tend to displace more than those at the first end until forces between the wedges became balanced, thereby creating a distributed loading on the cardlock clamp.

Figure 6A:
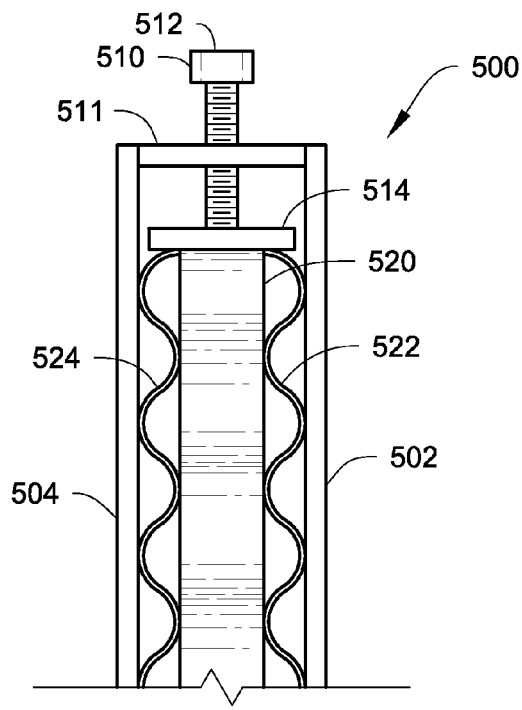
FIG. 6(a) illustrates a partial cross sectional view of another embodiment of a cardlock clamp having a horizontal wave spring and two vertical wave springs.

FIGS. 6(a) and (b) illustrate another embodiment of a cardlock clamp 500 that incorporates the concepts described herein. The cardlock clamp 500 includes a member in the form of two elongated L-shaped brackets 502 and 504 similar to the L-shaped brackets 202 and 204 described above. The L-shaped brackets 502 and 504 are only partially illustrated in FIG. 6a. When assembled, the brackets 502, 504 define a space that receives a plurality of force converting elements in the form of wave springs 520, 522, 524.

An input compression force mechanism is disposed at each end of the brackets. Similar to the clamp 200, each input compression force mechanism of the clamp comprises a screw 510 that extends through a threaded hole in an end wall 511 of one of the brackets. Each screw has a head 512 to facilitate actuating the screw, and the screw is engaged with or is integral with a plate 514.

The wave springs 520, 522 and 524 are disposed inside the space defined by the brackets 502, 504 and each wave spring has ends engaged by the plate 514. By actuating one or more of the screws 510 in the appropriate direction, an input compression force is applied to the wave springs.

Figure 6B:
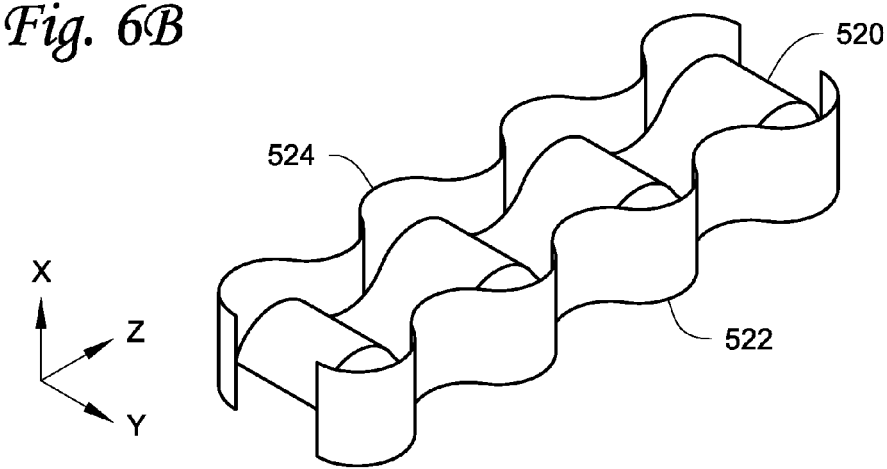
FIG. 6(b) is a perspective view of the wave springs inside the cardlock clamp of FIG. 6(a) with the horizontal wave spring flanked orthogonally by the two vertical wave springs.

FIG. 6(*b*) illustrates an exemplary arrangement of the wave springs 520, 522 and 524 inside the space. The wave springs extend along the z-direction. The wave spring 520 is horizontal and is flanked by the wave springs 522 and 524 orthogonally. It is contemplated that the wave springs can be interwoven. The wave spring 520 is expandable in the x-direction and the wave springs 522 and 524 are expandable in the y-direction when compressed. The amount of expansion of the wave springs can be suitably controlled by the configuration and material of the wave springs. Although three wave springs are described, any other number of wave springs greater than one can be used. For example, two wave springs along the z-direction, one being horizontal and the other being vertical can be used.

Upon an input compression force from the screw 510, the wave springs 520, 522 and 524 are compressed in the z-direction. The wave spring 520 expands in the x-direction and makes positive contact with at least one of the inner surfaces of the brackets. At the same time, the wave springs 522 and 524 expand in the y-direction and each of the wave springs 522 and 524 makes positive contact with the inner surfaces of the brackets. Consequently, the two L-shaped brackets 502 and 504 are pushed away from each other by the wave springs and generate clamping forces both in the x-direction and in the y-direction. When the screw force is withdrawn, each wave spring would recover its original shape to remove the clamping forces.

Figure 7A:
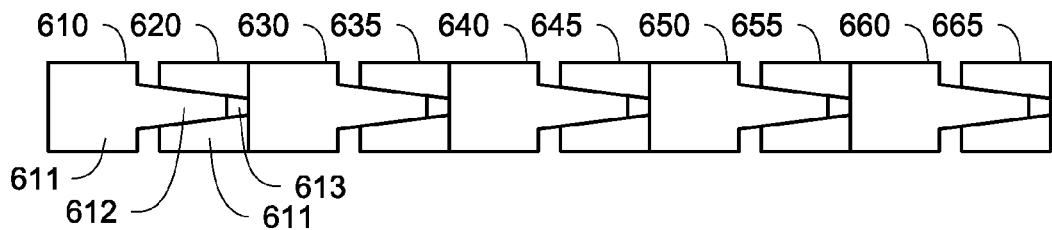
FIG. 7(a) is a side view of spring pins engaged with each other that can be used in another embodiment of a cardlock clamp.
Figure 7B:
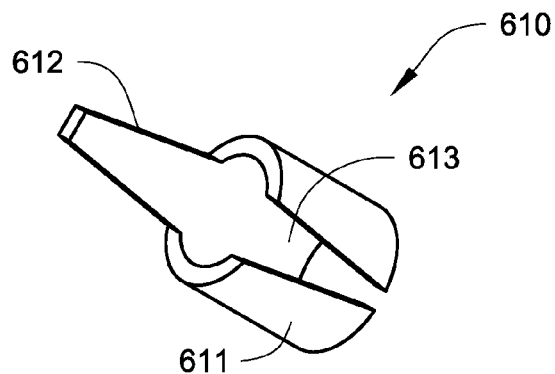
FIG. 7(b) is a perspective view of a single spring pin having an expandable sleeve section with a gap and a tang section.

FIGS. 7(*a*) and (*b*) illustrate another embodiment of a cardlock clamp 600 that incorporates the concepts described herein. The cardlock clamp 600 has a plurality of force converting elements in the form of spring pins that are engaged with each other. Although not illustrated in FIGS. 7(*a*)-(*b*), the spring pins can be disposed within a member that includes one or more input compression force mechanisms. For example, the member, including the input force compression mechanism, in this embodiment can be similar to the L-shaped brackets and input compression force mechanisms discussed above. Another suitable input compression force mechanism will be discussed below with respect to FIG. 8.

Figure 8:
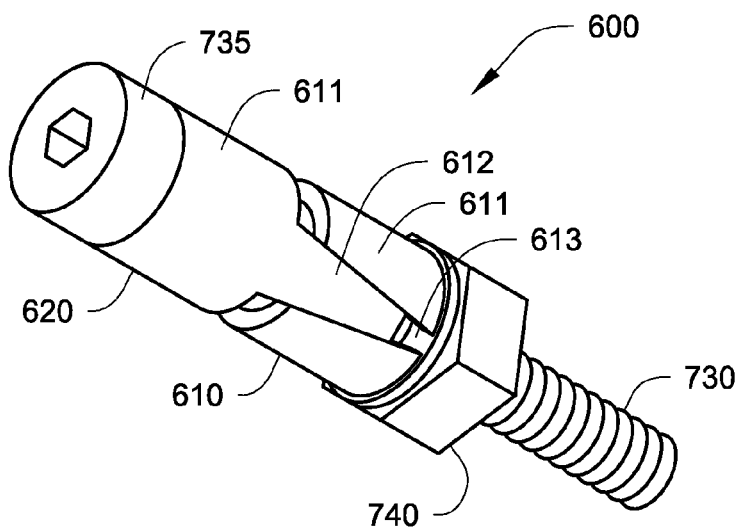
FIG. 8 is a perspective view of another embodiment of a cardlock clamp using the spring pins.

FIG. 7(*a*) is a side view of a plurality of the spring pins engaged with each other. Five pairs of spring pins 610 and 620, 630 and 635, 640 and 645, 650 and 655, and 660 and 665 are engaged with each other in the z-direction, respectively, forming an elongated, stacked arrangement. The spring pins are identical to each other. Although five pairs of identical spring pins are described, any other number of spring pins can be used to be engaged with each other. For example, FIG. 8 illustrates one pair of spring pins.

With reference to FIG. 7(*b*) which shows the spring pin 610 as an example, each spring pin has an expandable sleeve section 611 with a gap 613 and a tang section 612 extending from the sleeve section opposite the gap. The sleeve section 611 has an outer surface and an inner surface which are concentric. The gap 613 is defined by two side surfaces normal to the outer surface and the inner surface of the sleeve section 611. The tang section 612 has two sliding surfaces matching the side surfaces of the gap 613. The tang section 612 and the gap 613 are complementary to each other so that the tang section can fit into the gap of an adjacent spring pin as illustrated in FIGS. 7(*a*) and 8. The tang section 612 tapers in size as it extends away from the sleeve section 611. Similarly, the gap 613 tapers in size as it extends away from the tang section 612.

Returning to FIG. 7(*a*), the tang section of one spring pin is configured to fit into the gap of an adjacent spring pin. For example, the spring pin 610 engages and pairs with the spring pin 620. The tang section 612 of the spring pin 610 fits into the gap 613 of the spring pin 620, while the tang section 612 of the spring pin 620 fits into the gap 613 of the spring pin 610. Upon application of a compression force on one or both axial ends of the pin 610 or pin 620, the tang sections 612 sliding in the gaps 613 cause expansion of the sleeve sections 611 radially in all directions substantially perpendicular to the z-direction.

The other pairs of spring pins operate in a similar manner. Upon an input compression force on the end of at least one of the spring pins 610 or 665, each of the tang sections 612 slides into their respective gap 613, which expands the corresponding sleeve section 611 radially. The radial expansion of the sleeve sections 611 acts on the member, generating clamping forces in all directions substantially perpendicular to the z-direction to hold the circuit card in place in the channel.

FIG. 8 shows a cardlock clamp that uses a pair of the spring pins 610 and 620 engaged with each other. The tang section 612 of the spring pin 620 fits into the gap 613 of the spring pin 610 and expands the sleeve section 611 radially. In addition, the tang section 612 of the spring pin 610 fits into the gap 613 of the spring pin 620 and expands the sleeve section 611 radially. The input compression force mechanism includes a screw 730 and a nut 740. The screw 730 extends through the pins 610, 620 and is fixed to a head 735 that is engaged with the end of the spring pin 620. The pins 610, 620 are thus clamped between the head 735 and the nut 740. Rotation of the nut 740 in the appropriate direction draws the head 735 and nut 740 closer together, which generates a force driving the tang sections 612 into the gaps 613, thereby expanding the sleeve sections 611 radially. The clamp of FIG. 8 can be used with or without a member.

The spring pins in FIGS. 7(*a*)-(*b*) and 8 can also be used as a clamp mechanism in other applications. For example, the spring pin clamp mechanism in FIG. 8 could be used as an anchor in a blind hole such as in concrete. When used as an anchor in a blind hole, the clamp mechanism in FIG. 8 can be used without a member since the screw 730, head 735 and nut 740 will hold the spring pins together. Therefore, the clamp mechanism would include a plurality of force converting elements in the form of the spring pins and an input force compression mechanism. The clamp mechanisms in FIGS. 2(*a*)-(*c*), FIGS. 6(*a*)-(*b*) and FIG. 9 may also be effective as anchors in a blind hole, but would likely utilize a member to retain the plurality of force converting elements in place.

FIG. 9 illustrate another embodiment of a cardlock clamp 1000 that incorporates the concepts described herein. The cardlock clamp 1000 has a plurality of force converting elements in the form of tubes 1010-1025 that are engaged with each other. The tubes are disposed within a member in the form of two elongated L-shaped brackets 1002 similar to the L-shaped brackets discussed above. An input compression force mechanism 1006, similar to the input compression force mechanism in the cardlock clamp 500 of FIG. 6(*a*), is disposed at each end of the brackets.

The tubes are arranged with longitudinal axes along one of radial directions, such as an x-direction and a y-direction. For example, the tube 1010 is arranged with its longitudinal axis along the x-direction and the tube 1025 is arranged with its longitudinal axis along the y-direction. The tubes are compressible so that an input compression force along a z-direction from the input compression force mechanism 1006 would compress the tubes in the z-direction and expand the tubes in the x-direction or in the y-direction. Consequently, the L-shaped brackets 1002 are pushed away from each other by the tubes and generate clamping forces both in the x-direction and in the y-direction. Although the tubes are illustrated as having a cylindrical shape before applying the input compression force, tubes having other cross sectional shapes can be used, such as rectangle, polygon, oval or irregular shapes. In addition, although the tubes are illustrated as hollow, solid tubes can be used.

The ratio between the clamping force in the x-direction and in the y-direction can be controlled by varying the number of tubes facing in the x-direction and the number of tubes facing in the y-direction. Although 16 tubes are illustrated with 4 of them facing in the x-direction and 12 of them facing in the y-direction, a larger or smaller number of tubes can be used with an appropriate number of them facing in the x-direction and the remaining tubes facing in the y-direction.

Figure 10A:
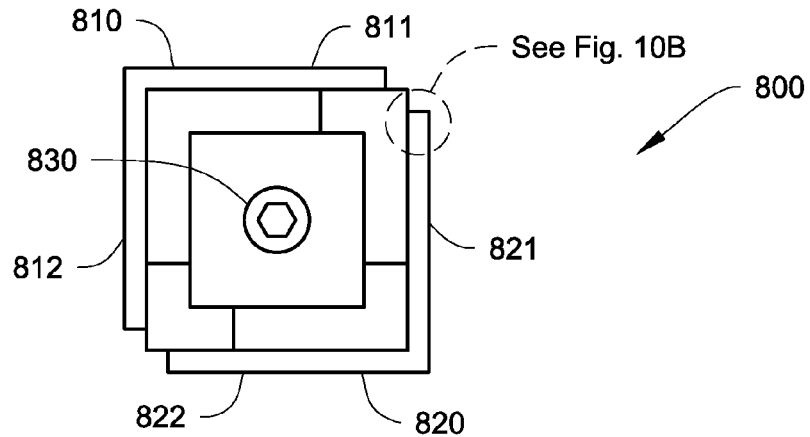
FIG. 10(a) illustrates an end view of another embodiment of cardlock clamp with a diamond coating on the surface.
Figure 10B:
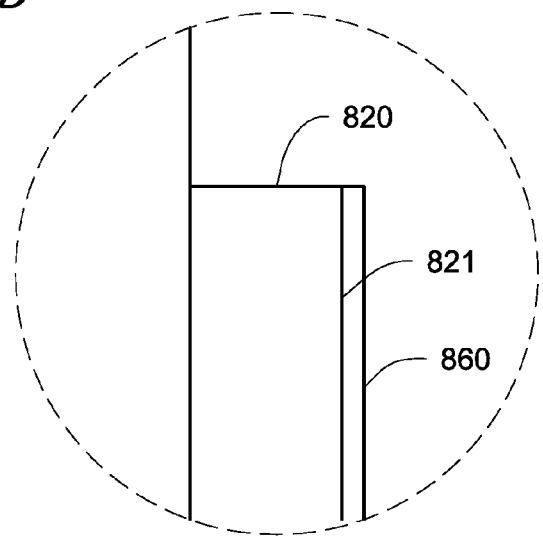
FIG. 10(b) is a cross sectional blow-up view of the diamond coating on the surface of the cardlock clamp of FIG. 8(a).

FIGS. 10(*a*) and (*b*) illustrate another embodiment of a cardlock clamp used to secure a circuit card in a channel. The cardlock clamp 800 has a movable clamp body including two L-shaped brackets 810 and 820, and a mechanism 830 for applying a clamping force to the clamp body. The cardlock clamp 800 can function similarly to the cardlock clamps 200, 500, 600 described above, with the L-shaped brackets 810 and 811 similar to the brackets 202 and 204 described in the cardlock clamp 200, and the mechanism 830 configured to input a compression force to a plurality of force converting elements. Alternatively, the cardlock clamp 800 can be similar to conventional cardlock clamps that operate based on an input tensile force, but with a highly conductive material discussed further below.

In the cardlock clamp 800, the L-shaped brackets 810, 820 are preferably made of a ceramic material suitable for receiving a diamond coating. In other embodiments, the clamp body can be made of other materials as long as those materials are able to receive a diamond coating thereon. The L-shaped brackets are identical in construction, with the bracket 810 having a first surface 811 and a second surface 812 connected to the first surface 811, and the bracket 820 having a first surface 821 and a second surface 822 connected to the first surface 821.

A thick diamond coating is disposed on the first and second surfaces of the L-shaped brackets. For example, a first layer of diamond is coated on the first surface 811 and the second surface 812 of the L-shaped bracket 810; a second layer of diamond is coated on the first surface 821 and the second surface 822 of the L-shaped bracket 820.

FIG. 10(*b*) is a partial cross sectional blow-up view of FIG. 10(*a*). The layer of diamond 860 is coated on the surface of the bracket 820. The diamond layer has a thickness of, for example, about 0.03 inches. The layer of diamond 860 has a substantially flat surface finish and is made of, for example, diamond by physical or chemical deposition. In other embodiments, the layer of diamond 860 can be made of other highly thermally conductive materials such as diamond-like carbon, synthesized carbon, carbon nano-tube, copper, aluminum or their compounds. The material of the diamond or other highly thermally conductive material coatings has higher thermal conductivity than the material of the clamp body.

Returning to FIG. 10(*a*), since the material of the diamond coating has higher thermal conductivity than the material of the clamp body, the diamond coating defines two heat transfer paths: one from the first surface 811 to the second surface 812 of the L-shaped bracket 810, the other from the first surface 821 to the second surface 822 of the L-shaped bracket 820. For example, when the cardlock clamp 800 is installed, the diamond coating 860 on the first surface 821 of the L-shaped bracket 820 makes positive contact with the circuit card, and the diamond coating 860 on the second surface 822 makes positive contact with a heat sink, such as the bottom or side surface of the channel 120 in the card cage 100; at the same time, a diamond coating on the first surface 811 of the L-shaped bracket 810 makes positive contact with the circuit card, and the diamond coating on the second surface 812 makes positive contact with the heat sink, such as the side or bottom surface of the channel 120 in the card cage 100. Heat is transferred from the circuit card along the two heat transfer paths to the heat sink instead of propagating through the clamp body. However, it is contemplated that the clamp body itself can be made of highly thermally conductive materials such as diamond, diamond-like carbon, synthesized carbon, carbon nano-tube, copper, aluminum and their compounds so that heat can be transferred from the circuit card through the clamp body.

Figure 11:
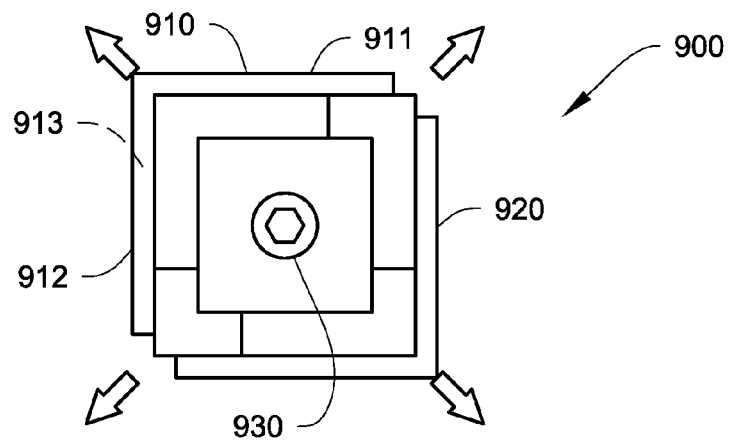
FIG. 11 illustrate an end view of another embodiment of cardlock clamp with movable brackets configured as heat pipes.

FIG. 11 illustrate another embodiment of a cardlock clamp 900. The cardlock clamp 900 has a clamp body including a first movable bracket 910. The bracket 910 is, for example, an L-shaped bracket which is hollow and has inner and outer surfaces which define a closed cavity. The bracket 910 is made of, for example, materials which can conduct heat. The cardlock clamp 900 also has a mechanism 930 for applying a clamping force to the first bracket 910. The cardlock clamp also has a second movable bracket 920 similar to the first movable bracket 910.

At least one of the brackets 910, 920 is configured as a heat pipe. For example, the first movable bracket 910 can be configured as a heat pipe. The heat pipe has a vaporization side 911, a condensing side 912 spaced from the vaporization side 911, and a two-phase heat transfer fluid 913 is disposed within the closed cavity of the bracket 910.

When the cardlock clamp 900 is installed, the vaporization side 911 engages the circuit card and the condensing side 912 engages a heat sink. Heat is transferred from the circuit card along the heat pipe to the heat sink through the two-phase heat transfer fluid 913.

Although the bracket 910 is described as being configured as a heat pipe, in other embodiments, at least one heat pipe can be embedded inside the bracket 910. Alternatively, the at least one heat pipe can be attached to the outer surfaces of a solid bracket. The at least one heat pipe may follow a serpentine path to allow sonic velocities for the thermal transfer from the condensation portion to the vaporization portion.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A spring pin, comprising:
    a radially expandable sleeve section having a first end and a second end;
    a gap formed in the expandable sleeve section from the first end to the second end, the gap is defined by two spaced side surfaces, and the gap tapers in size such that a distance between the side surfaces increases as the gap extends from the first end; and
    a tang section extending from the first end of the expandable sleeve section at a location opposite the gap, the tang section is defined by two sliding surfaces, and the tang section tapers in size such that a distance between the sliding surfaces decreases as the tang section extends away from the expandable sleeve section.

2. The spring pin of claim 1, wherein the gap and the tang section are complementary in shape to one another.

3. The spring pin of claim 1, wherein the gap tapers in size the entire distance from the first end to the second end, and the tang section tapers in size along the entire length of the tang section.

4. The spring pin of claim 1, wherein the expandable sleeve section is ring-shaped with a central opening from the first end to the second end, the central opening has a longitudinal axis perpendicular to an expansion direction of the expandable sleeve section and parallel to the tang section.

5. A clamp mechanism, comprising:
   first and second spring pins, each of the spring pins including:
      a radially expandable sleeve section having a first end and a second end;
      a gap formed in the expandable sleeve section from the first end to the second end, the gap is defined by two spaced side surfaces, and the gap tapers in size such that a distance between the side surfaces increases as the gap extends from the first end; and
      a tang section extending from the first end of the expandable sleeve section at a location opposite the gap, the tang section is defined by two sliding surfaces, and the tang section tapers in size such that a distance between the sliding surfaces decreases as the tang section extends away from the expandable sleeve section
   the first and second spring pins are arranged such that the tang section of the first spring pin is within the gap of the second spring pin, and the tang section of the second spring pin is within the gap of the first spring pin; and
   an input compression force mechanism engaged with the first and second spring pins and that is configured to input a compression force in a z-direction perpendicular to the radial expansion direction of the first and second spring pins, wherein application of a compression force by the input compression force mechanism cause expansion of the expandable sleeve sections of the first and second spring pins radially in all directions substantially perpendicular to the z-direction.

6. The clamp mechanism of claim 5, wherein for the first and second spring pins, the gap and the tang section are complementary in shape to one another.

7. The clamp mechanism of claim 5, wherein for each of the first and second spring pins, the gap tapers in size the entire distance from the first end to the second end and the tang section tapers in size along the entire length of the tang section.

8. The clamp mechanism of claim 5, wherein for each of the first and second spring pins, the expandable sleeve section is ring-shaped with a central opening from the first end to the second end, the central opening has a longitudinal axis perpendicular to an expansion direction of the expandable sleeve section and parallel to the z-direction, and the central openings of the first and second springs pins are aligned with each other.

9. The clamp mechanism of claim 5, wherein the input force compression mechanism is configured to engage the second end of one or both of the first and second spring pins.

10. The clamp mechanism of claim 8, wherein the input force compression mechanism comprises a screw that extends through the aligned central openings of the first and second spring pins, a head at one end of the screw, and a nut that threads onto the screw, and the first and second spring pins are disposed between the head and the nut.

11. The clamp mechanism of claim 5, further comprising a member that defines a cavity in which the spring pins are disposed.

12. The clamp mechanism of claim 11, wherein the member comprises a plurality of brackets that are moveable relative to each other and that define the cavity.

* * * * *